United States Patent
van Zeijl et al.

(10) Patent No.: US 8,238,838 B2
(45) Date of Patent: Aug. 7, 2012

(54) CALIBRATION OF TRANSMIT SIGNALS IN FDD-TRANSCEIVERS

(75) Inventors: Paulus Thomas Maria van Zeijl, Veldhoven (NL); Neil Christopher Bird, Eindhoven (NL)

(73) Assignee: ST-Ericsson SA, Geneva (CH)

( * ) Notice: Subject to any disclaimer, the term of this patent is extended or adjusted under 35 U.S.C. 154(b) by 449 days.

(21) Appl. No.: 12/309,255

(22) PCT Filed: Jul. 9, 2007

(86) PCT No.: PCT/IB2007/052696
§ 371 (c)(1),
(2), (4) Date: Jan. 11, 2010

(87) PCT Pub. No.: WO2008/007329
PCT Pub. Date: Jan. 17, 2008

(65) Prior Publication Data
US 2010/0112962 A1    May 6, 2010

(30) Foreign Application Priority Data
Jul. 11, 2006   (EP) ..................................... 06116929

(51) Int. Cl.
*H04B 1/38*    (2006.01)

(52) U.S. Cl. .............................. 455/73; 455/77; 370/281

(58) Field of Classification Search ..................... 455/73, 455/77; 370/281
See application file for complete search history.

(56) References Cited

U.S. PATENT DOCUMENTS

| | | | |
|---|---|---|---|
| 2004/0106381 A1 | 6/2004 | Tiller | |
| 2004/0203548 A1 | 10/2004 | Kim | |
| 2005/0207509 A1 | 9/2005 | Saunders et al. | |

FOREIGN PATENT DOCUMENTS

| | | | |
|---|---|---|---|
| WO | WO 01/63791 | * | 8/2001 |
| WO | WO 01/63791 A2 | | 8/2001 |
| WO | WO 02/37706 | * | 5/2002 |
| WO | WO 02/37706 A1 | | 5/2002 |

OTHER PUBLICATIONS

International Search Report issued by the International Searching Authority in connection with PCT Patent Application No. PCT/2007/052696.
Written Opinion issued by the International Searching Authority in connection with PCT Patent Application No. PCT/2007/052696.

* cited by examiner

*Primary Examiner* — Tuan H Nguyen

(57) ABSTRACT

By the present invention a calibration and/or correction of transmit signals in a communication system using Frequency Division Duplex has been disclosed, in particular a method of calibration of a transmit signal to be transmitted in a device simultaneously receiving and transmitting signals in the communication system, wherein the transmit signal and the receive signal are separated by a predetermined frequency band gap. A down-conversion of the transmit signal received in the receiving path to an intermediate frequency is performed, whereby the intermediate frequency corresponds to the frequency band gap reduced by the intermediate frequency of the receive signal. A correction signal is derived from the intermediate received transmit signal and used to calibrate the transmit signal such that non-linearity effects caused by power amplifiers in the transmit path are effectively reduced. The present invention provides the advantages of an improved and simplified architecture and simultaneously of a clearly improved quality of transmit signals.

14 Claims, 6 Drawing Sheets

CALIBRATION OF TRANSMIT SIGNALS IN FDD-TRANSCEIVERS

CROSS-REFERENCE TO RELATED APPLICATION(S)

The present application claims priority under 35 U.S.C. §365 to International Patent Application No. PCT/IB2007/052696 filed Jul. 9, 2007, entitled "CALIBRATION OF TRANSMIT SIGNALS IN FDD-TRANSCEIVERS". International Patent Application No. PCT/IB2007/052696 claims priority under 35 U.S.C. §365 and/or 35 U.S.C. §119(a) to European Patent Application No. 06116929.8 filed Jul. 11, 2006 and which are incorporated herein by reference into the present disclosure as if fully set forth herein.

FIELD OF THE INVENTION

The present invention relates to calibration or measuring of a transmit signals in a transceiver operated in a FDD communication system. In particular the present invention relates to a method of calibration of a transmit signal to be transmitted in a device simultaneously receiving and transmitting signals in the communication system, a transceiver representing the device simultaneously receiving and transmitting signals in the communication system, and a computer program product comprising code means for carrying out the method.

BACKGROUND OF THE INVENTION

Third-generation (3G) mobile phone technologies, such as Universal Mobile Telecommunications System (UMTS) and Wideband Code Division Multiple Access (WB-CDMA) standards represent extensions of the second-generation (2G) mobile phone technologies like the Global System for Mobile Communications (GSM) or Enhanced Data rates for GSM Evolution (EDGE). One aspect crossing all of the present standards of mobile phone technologies and reached from the one generation to the next (there from 2G to 3G) is that they are using non-constant envelope modulation. In communication systems with non-constant envelope modulation a problem resides in the non-linearity of the power amplifier (PA) in the transmitter stages, a solution of which are compensation measures resulting a low efficiency compared to constant-envelope transceivers.

The architecture of non-constant-envelope transceivers can, for instance, be linearized by feedback loops like Cartesian feedback or polar-loop feedback, which instantaneously measure the quality of the transceiver output signal and correct the input signal of the transceiver power amplifier (TX-PA) such that the quality with regard to linearity is improved. In this way the efficiency, Error Vector Magnitude (EVM), representing a measure used to quantify the performance of a phase-shift modulation radio demodulator, and Adjacent Channel Power Ratio (ACPR), defined as the ratio of the average power in the adjacent frequency channel to the average power in the transmitted frequency channel, may be optimized simultaneously.

However, present techniques implementing feedback loops like Cartesian feedback or polar-loop feedback require complex and expensive design of down-converters, filters, and control amplifiers. In the case that the correction is done in the digital domain, extra Analog-to-Digital- (A/D-) and Digital-to-Analog- (D/A-) converters are required. Apart from the design effort needed, also the extra power consumption and silicon area may be prohibitively high. Additionally, extra receiving paths have to be designed when Cartesian or polar feedback loops are used. Beside the complex design also the disadvantage of extra power consumption arises, which is caused by the components like low-noise amplifiers, mixers, Intermediate Frequency (IF) filters, and amplifier-stages, and if required also by extra Radio Frequency (RF) Voltage Controlled Oscillator (VCO) or Phase Locked Loop (PLL), A/D- and D/A-converters, and also by an extra silicon area associated with this extra feedback loop.

SUMMARY OF THE INVENTION

It is one object of the present invention is to improve the state of art solutions. In particular, it is one object of the present invention to ensure an improved quality of the transmitted signals without loss of efficiency and at the same time to avoid high design effort concerning components and means guaranteeing the quality of the signals.

This object is achieved by a method of calibration of a transmit signal to be transmitted in a device simultaneously receiving and transmitting signals in a communication system, which device comprises a receiving path for a receive signal, a transmit path for the transmit signal, a calibration path for a correction signal, the transmit signal being also received in the receiving path and the transmit signal and the receive signal being separated by a predetermined frequency band gap, the method comprising:

down-converting the received transmit signal to an intermediate frequency by mixing the received transmit signal with a first local oscillator frequency in the receive path, wherein the intermediate frequency substantially corresponds to the frequency band gap reduced by the intermediate frequency of the receive signal;

deriving a correction signal from the received transmit signal converted down in the down-converting step, wherein the deriving step is performed in the calibration path; and calibrating the transmit signal by acting with the correction signal on the transmit path upon the transmit signal to be transmitted.

Further, the object is achieved by a transceiver simultaneously receiving and transmitting signals in a communication system, wherein the transceiver comprises a receiving path for a receive signal; a transmit path for a transmit signal; and a calibration path for a correction signal, wherein the transmit signal and the receive signal being separated by a predetermined frequency band gap and the transmit signal being also received in the receive path, which device comprises:

down-conversion means arranged to down convert the received transmit signal to an intermediate frequency by mixing the received transmit signal with a first local oscillator frequency in the receive path, wherein the intermediate frequency corresponds substantially to the frequency band gap reduced by the intermediate frequency of the receive signal;

deriving means arranged to derive a correction signal as the correction signal in the conversion path from the received transmit signal converted down by the down-conversion means; and calibrating means arranged to calibrate the transmit signal by acting with the correction signal on the transmit path upon the transmit signal.

Furthermore, the object is achieved by a computer program product comprising code means for carrying out the method for controlling calibration of a transmit signal, the computer program product performing the steps of a method according to the any one of the method claims when run on a respective microcontroller of a transceiver controlled by the microcontroller.

The present invention can be used in communication systems using Frequency Division Duplex (FDD) where the uplink and downlink sub-bands are said to be separated by a "frequency offset". Thus, a predetermined frequency band gap between the transmit signal and the receive signal is provided in a device simultaneously receiving and transmitting signals like a transceiver. Such communication systems can be for example Time Division Multiple Access (TDMA), Code Division Multiple Access (CDMA), Wideband Code Division Multiple Access (WB-CDMA or WCDMA) or Universal Mobile Telecommunications System (UMTS), High-Speed Downlink Packet Access (HSDPA), Global System for Mobile Communications (GSM) or General Packet Radio Service (GPRS), or Enhanced Data Rates for GSM Evolution (EDGE). However, the present invention does not confine the area of appliance just to the above listed communication system. Generally the fact that a frequency division is used or provided in the communication system should be regarded as a spring point for a communication system where the present invention could be implemented.

Accordingly, the general principle of the invention lies in the perception that in FDD communication systems the predetermined frequency band gap between the transmit signal and the receive signal can be used such that the transmit signal which is also received in the receiving path and processed by down-conversion means in the receiving path will be present at a well defined intermediate frequency. This intermediate frequency of the received transmit signal can be expressed by a relation such that the intermediate frequency of the received transmit signal corresponds to the frequency band gap between the transmit signal and the receive signal reduced by the intermediate frequency of the receive signal. It is worth noting that even in case the receiving path is implemented as a direct conversion receiver which converts the receive signal down into the base band, the intermediate frequency is zero, which configuration is a so-called zero-IF-receiver.

As it regards correction of the transmit signal, for instance, a common phenomenon in transmitters, more precisely with power amplifiers (PA) designs used in transmitters, is that the PA introduces third-order intermodulation distortion. More information may be gathered from, for instance, Section 2.1.1 in Behzad Razavi, "RF Microelectronics", Prentice Hall, 1998, ISBN 0-13-887571-5. In order to avoid such third-order intermodulation, the PA is to be operated at relatively low output powers (compared to its bias current/voltages), thus reducing efficiency. By reduction of the third-order intermodulation by correction or calibration as proposed herein, the PA can be operated at higher output powers, thus at higher efficiencies.

According to one embodiment of the present invention, first down-converting is performed on the receive path, where the received transmit signal is down-converted to an intermediate frequency in the receive path. The used receiver architecture generally is that of an IF-receiver. In a deriving step, where the analog correction signal is received, the received transmit signal down-converted in the previous down-converting step is converted down a second time into the base band in the calibration path. Here, mixing with a further local oscillator frequency can be implemented such that the received transmit signal down-converted in the previous down-converting step is converted down to a zero-IF-band (zero intermediate frequency band).

The analog signal received after both down-conversions is used as a analog correction signal, which can correct or calibrate an transmit signal on the transmit path directly or which can be converted to a digital signal, which in turn is send to the transceiver for correction or calibration purposes. The digital signal may also be pre-distorted before the corresponding digital correction or calibration.

The embodiment above provides an improved quality of the transmitted signals since effects to the non-constant envelope signal by non-linearity of power amplifiers in transmit path are compensated for. Further, a simplified architecture or design of a transceiver is realized simultaneously. Additionally, the processing of the IF-signal needs clearly reduced power consumption in comparison to methodologies of the state of the art.

According to a second embodiment, the received transmit signal is converted down by mixing the received transmit signal with a first local oscillator frequency in the receiving path to a zero-IF-band (zero intermediate frequency band) in the receive path. For instance, in case of hetero-dyne receiver architecture in the receiving path by appropriate choice of the mixing frequency the desired conversion of the received transmit signal can be achieved. The analog signal gained after the down-conversion of the received transmit signal can be used directly as an analog correction signal, wherein the correction or calibration is performed like the correction or calibration described in the first embodiment. The calibrating step is acted then according to the present embodiment upon the transmit signal in base band. Again, the quality of the transmitted signals is improved by compensating for effects to the non-constant envelope signal by the non-linearity of the power amplifiers in transmit path. Moreover, the second embodiment provides even more simple architecture of a transceiver, as just a single local oscillator (a voltage controlled oscillator (VCO) for example) is needed if the transceiver comprises a direct-up-conversion architecture.

According to a third embodiment, the transmit signal in the transmit path is up-converted to an intermediate transmit signal by mixing the transmit signal with a third local oscillator frequency in the transmit path. Since the intermediate frequency for the transmit signal corresponds to the value of the frequency band gap, the up-converted transmit signal can be calibrated or corrected by a correction signal derived from an intermediate down-converted received transmit signal as in the first embodiment. Also the third embodiment provides a quite simple architecture of a transceiver and a clearly improved quality of transmit signals at once.

According to a fourth embodiment, after A/D-conversion of the receive signal, that is the receiving signal as well as the received transmit signal, before any channel filtering of the desired receive signal, the "leaked" transmit signal may be filtered and then be converted down to the base band—if required—in the digital domain and then used for correction/calibration of the transmitter in base band in the digital domain. This embodiment, when the architecture only uses digital signals for correction, has the advantage that nearly all required correction circuitry is located in the digital domain. In other words, according to the basic concept herein, in this embodiment the calibration path and all required steps for generating the digital correction signal is located in the digital domain only. Of course it is noted that nevertheless correction in the analog domain may additionally be used.

Thus, by the present invention calibration and/or correction of transmit signals in a communication system using Frequency Division Duplex is provided, in particular a method of calibration of a transmit signal to be transmitted in a device simultaneously receiving and transmitting signals in the communication system, wherein the transmit signal and the receive signal are separated by a predetermined frequency band gap. A down-conversion of the transmit signal received in the receiving path to an intermediate frequency is performed, whereby the intermediate frequency corresponds to the frequency band gap reduced by the intermediate frequency of the receive signal. A correction signal is derived from the intermediate received transmit signal and used to calibrate the transmit signal such that non-linearity effects caused by power amplifiers in the transmit path are effectively reduced. The present invention provides the advantages of an improved and simplified architecture and simultaneously of a clearly improved quality of transmit signals.

These and other aspects of the invention will be apparent from and elucidated with reference to the embodiments described hereinafter.

BRIEF DESCRIPTION OF THE DRAWINGS

Other objects and features will become apparent from the following detailed description considered in conjunction with the accompanying drawings. It is to be understood, however, that the drawings are designed solely for purposes of illustration and not as a definition of the limits of the invention, for which reference should be made to the appended claims only. It should be further understood that the drawings are merely intended to conceptually illustrate the structures and procedures described herein. In the drawings:

DETAILED DESCRIPTION OF EMBODIMENTS

Figure 1:
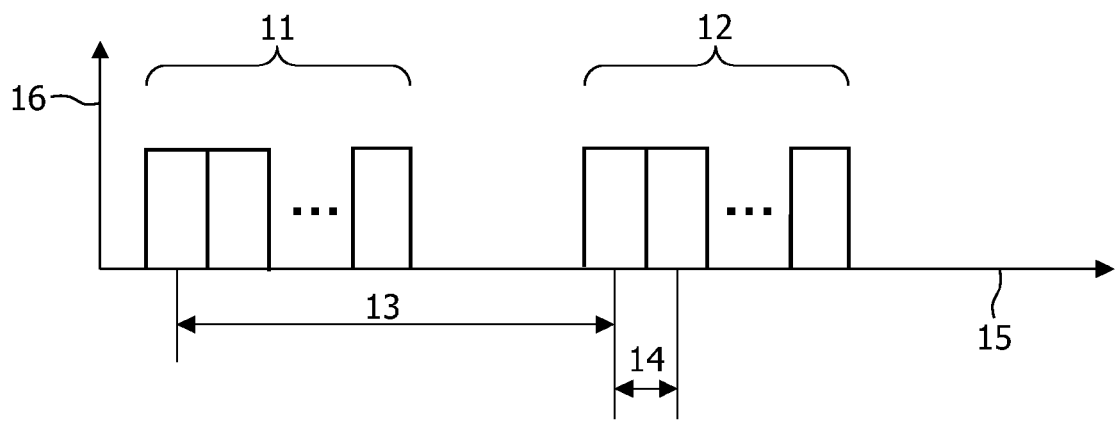
FIG. 1 shows UMTS FDD as an example for a communication systems using Frequency Division Duplex (FDD)

As the present invention is most applicable for communication systems using Frequency Division Duplex (FDD), FIG. 1 illustrates the predetermined frequency band gap between the transmit signal and the receive signal of the UMTS duplex communication channels. There, the axis 15 represents the frequency axis and the axis 16 represent the respective signal. Generally, duplex communication system is one where a signal flow can be present simultaneously in both directions between communicating parties. Further, in FDD frequency-division multiple access is used to separate outward and return signals. The respective uplink and downlink sub-bands of a certain channel are said to be separated by a "frequency offset". The advantage of FDD is the efficiency in case of symmetric traffic. Another advantage of FDD is that it makes radio planning easier and more efficient since base stations do not "hear" each other as they transmit and receive in different sub-bands and therefore will normally not interfere each other.

In UMTS FDD, as the used illustrating example, uplink signals are using frequencies between 1920 and 1975 MHz and downlink signals in turn are using frequencies between 2110 and 2165 MHz. In FIG. 1, twelve uplink bands 11 and twelve downlink bands 12, each representing a small section of the spectrum of a corresponding radio communication frequency, in which channels are used or set aside for the same purpose, with 190 MHz duplex distance 13 and ~5 MHz carrier spacing 14 are represented. According to the present invention, the term gap or frequency band gap means a space or distance between the transmit signal band and the receive signal band. When regarding the FIG. 1, the duplex distance 13 can be considered as a gap according to the present invention. The term frequency band in turn concerns a frequency range representing a range of frequencies for which certain circuits of a device are designed to operate or in which certain information is modulated for transmission. When the receive signal is up- or down-converted in the receive path, the received transmit signal in the receiving path will also be up- or down-converted. However, the frequencies of the corresponding receive signals and of the corresponding received transmit signals will always provide the same frequency band gap.

Figure 2:
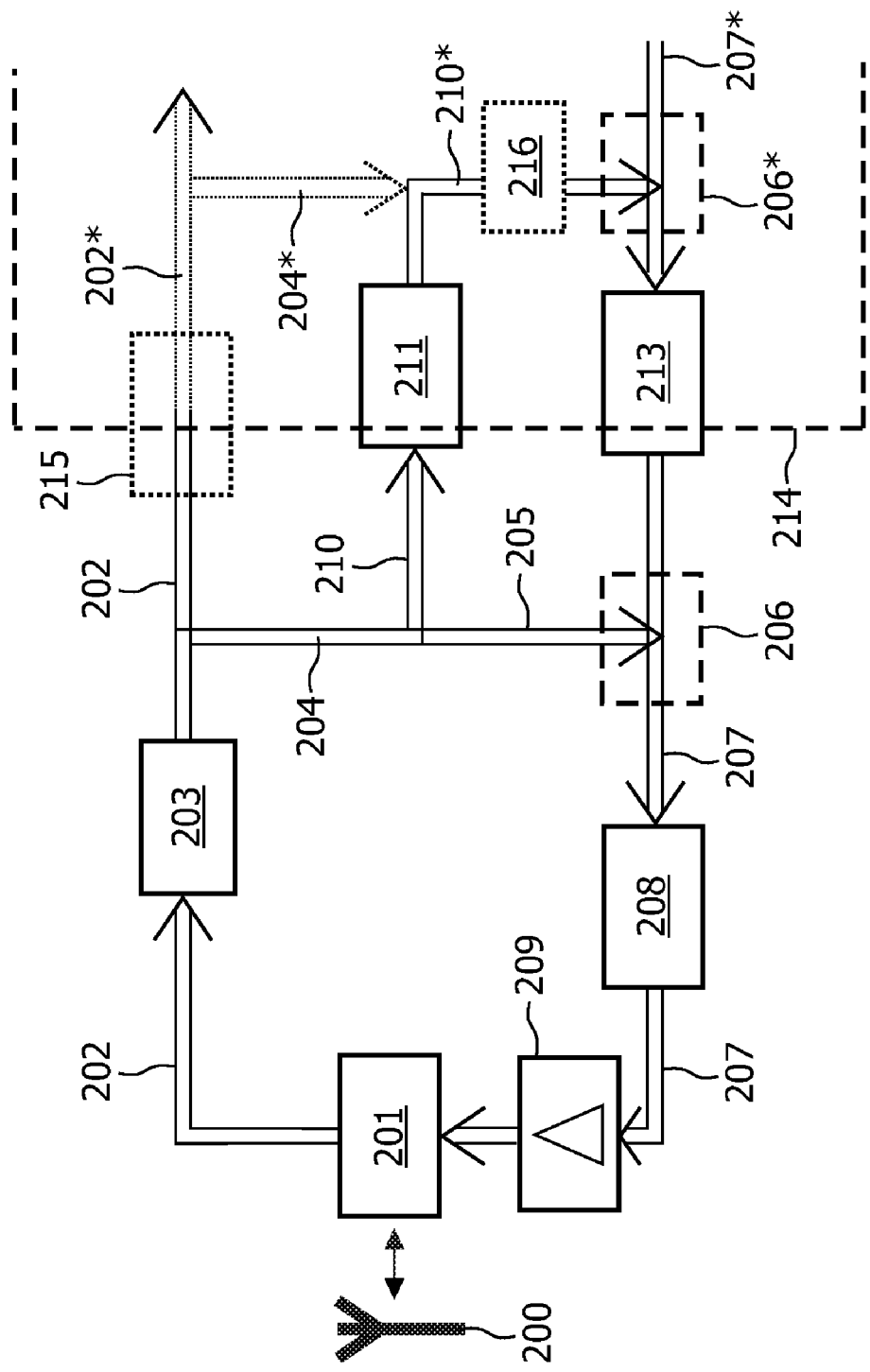
FIG. 2 shows a block diagram representing the general concept of the calibration of a transmit signal to be transmitted in accordance with the present invention.

Now reference is made to FIG. 2 which shows a block diagram illustrating the general concept of the calibration of a transmit signal to be transmitted in accordance with the present invention.

Accordingly, a device or a transceiver respectively is used capable of simultaneously receiving and transmitting signals in a communication system like UMTS-FDD or CDMA-FDD. The transceiver comprises a receiving path (RX) 202 for a receive signal (RXS), a transmit path (TX) 207 for a transmit signal (TXS) and possible embodiments for the calibration path 204, 204\*, 205, 210, and 210\* for a correction signal.

Further, as the transceiver acts in a FDD communication system, there is a predetermined frequency band gap between the transmit signal (TXS) and the receive signal. In the example of FIG. 1, the UMTS FDD, the frequency band gap or frequency offset comprises 190 MHz.

Furthermore, due to the fact that the transceiver provides for duplex communication within the receiver is always on during transmission like it is the case in UMTS-FDD and CDMA-FDD standards. Moreover, to attain a high integration, for instance, when integrating the transmitter and receiver of the transceiver on a single silicon die, and when expensive shielding techniques are avoided, the transmit signal of the transmit path will always be inserted or leak, respectively, into the receiving path.

As it can be seen from the FIG. 2, the receiving path 202 starts with at least one antenna 200 for a receive signal, which after the antenna is filtered by appropriate means 201, a duplex filter for example which is known per se, to attenuate signals outside the desired receive band. That is, also the transmit signal is attenuated somewhat. However, for reasons mentioned above, the transmit signal transmitted in the transmit path 207 is also received and processed in the receiving path 202, together with the receive signal.

It should be noted that in the following, for reasons of clarity, the transmit signal transmitted simultaneously or at the same time in the receiving path 202 will be indicated as the received transmit signal to be able to differentiate it from the general transmit signal transmitted on the transmit path 207.

In the receiving path 202, the received transmit signal is down converted by the same converting means 203 which are configured to down-convert the receive signal. Thereby, the received transmit signal is down-converted in the receiving path 202 to a well defined intermediate frequency, which can be derived mathematically by the relation such that intermediate frequency of the received transmit signal corresponds to the frequency band gap between the transmit signal and the receive signal reduced by the intermediate frequency of the receive signal.

Next, the received transmit signal down-converted in the receiving path 202 at the well-defined intermediate frequency can be used for derivation of an analog correction signal in a calibration path 204 in the analog domain. After that, the transmit signal to be transmitted can be calibrated in the transmit path 207 by acting upon the transmit signal with the analog correction signal derived in the calibration path 204.

As to the down-converting of the received transmit signal, this is performed by down-conversion means 203 in receiving path 202, which means can be implemented as comprising at least one mixer and a first local oscillator, for example, the function of which is known per se. For down-conversion the received transmit signal is mixed with the frequency of the first local oscillator comprised in the down-conversion means 203 located in the receiving path 202.

After the down-conversion, from the received transmit signal down-converted in the receiving path 202 at the well-defined intermediate frequency an analog correction signal can be derived. For that purpose, several configurations are feasible. The afore-mentioned analog correction signal can be derived after the down-conversion directly. However, the possibility of providing useful intermediate steps is also allowed by the present invention. A further embodiment will provide an example where an intermediate step is implemented. Thus, the analog correction signal can be derived by or in the conversion path 204 or 205.

As it can be seen in FIG. 2, the calibration path 204 can split or branch in two calibration paths 205 and 210. It is noted that according to the present invention, the calibration of the transmit signal is possible in at least one of two ways: the already mentioned analog correction or calibration with the analog correction signal; or a digital correction or calibration in the digital domain of the transceiver. The two parts—the analog part and the digital part (also depicted by the asterix *)—are separated by the dashed border 214 in FIG. 2, demarking the digital domain (*) of the transceiver.

In the case of the digital correction or calibration the transceiver—as a first alternative way—comprises: converting means 211 arranged to convert the analog correction signal into a digital signal; pre-distorting means 216 arranged to generate a digital correction signal by pre-distorting the digital signal; and calibration means 206* arranged to calibrate the transmit signal to be transmitted by acting upon the transmit signal to be transmitted with the digital correction signal on the transmit path 207* in the digital domain. Converting means 213 represent, for instance, a D/A-converter converting the corrected transmit signal in digital form into an analog transmit signal in the transmit path 207 in the analog domain. According to the present invention, the digital signal pre-distorted by the pre-distortion means 216 is used as digital correction signal. Thus, for the digital correction or the digital calibration the analog correction signal is converted into a digital signal; a digital correction signal is generated by pre-distortion of the digital signal; and the transmit signal to be transmitted is calibrated by acting upon the digital transmit signal to be transmitted with the digital correction signal on the transmit path 207* in the digital domain.

FIG. 2 illustrates a second way for attaining the desired calibration or correction of the transmit signal in the digital domain. After the A/D-conversion means 215 in the receiving path 202, the receive signal comprising the receiving signal as well as the received transmit signal, before any channel filtering of the desired receive signal is performed, the "leaked" transmit signal may be filtered (not shown) and converted down to the base band (not shown)—if required—in the digital domain and then used for correction/calibration of the transmitter in base band in the digital domain. This is depicted by the digital calibration path 204*. This architecture, in particular when only a digital correction signals is used, provides the advantage that all correction circuitry is located in the digital domain.

It is self-evident, that as well the digital correction or calibration as the analog correction or calibration can comprise several intermediate steps useful to accelerate or to improve the calibration step or means.

Further, FIG. 2 shows means for up-conversion 208 of the calibrated or corrected transmit signal in the transmit path into the transmit frequency band. Up-conversion 208 can be realized as comprising at least one mixer and a local oscillator for example, both represented behind the up-conversion means 208 in FIG. 2. However, they do not necessarily play an important part as will be shown in the embodiment of FIG. 3. The embodiment of FIGS. 4 and 5 in turn makes use of corresponding up-conversion means 208 located in the transmit path 207. Thus, in FIG. 2 at first just the fact is shown, that a signal to be transmitted is up-converted before the transmission.

At the end, the transmit signal is amplified by the power amplifier 209 and finally sent to the antenna 200.

As it will be shown herein below by further embodiments of the present invention, frequency down-conversion stage, step or means are used to measure the quality of the transmitted signal, and accordingly take action to improve this quality. As already explained above, the action maybe to instantaneously correct the transmit signal by the analog correction or calibration means 206 on the analog calibration path 205 or by the digital correction or calibration means 206* on the digital calibration path 210* where a pre-distorted digital signal or digital correction signal respectively acts upon a incoming transmit signal. In general the purpose of the correction or calibration is to compensate for the effects on a non-constant envelope signal which effects are caused by non-linearity of amplifier stages in the transmit path, for example distortions caused by third-order products generated in the PA of the amplifier stage 209. Of course, both possibilities of correction or calibration (analog and/or digital) may be used at once—the whole calibration path is thus represented by combinations of the corresponding paths 204, 204*, 205, 210, and 210*. However, the present invention provides the designer of a device simultaneously receiving and transmitting signals (a transceiver) the latitude to use either one of the calibration paths 205, 210* or to use both at once.

Figure 3:
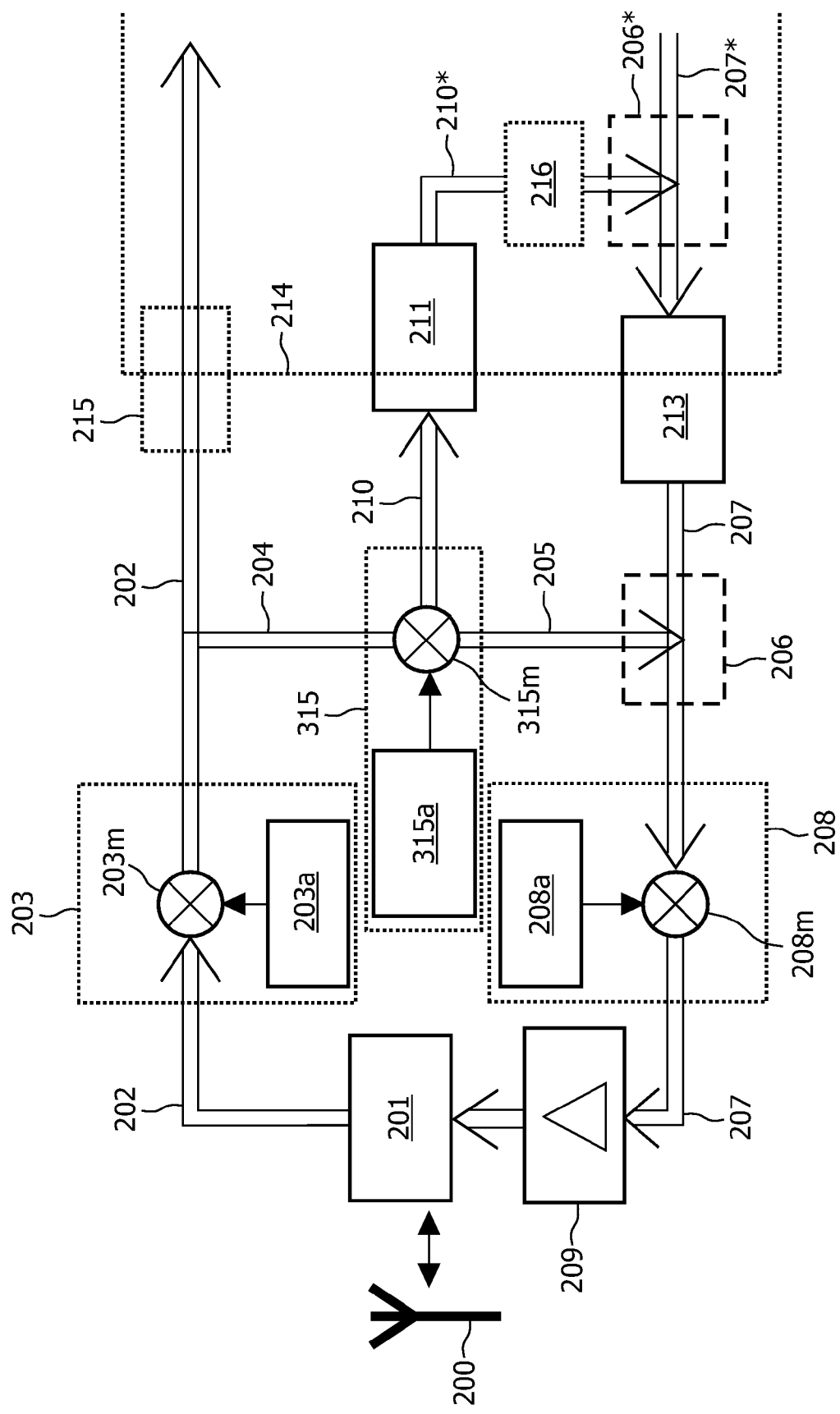
FIG. 3 shows a calibration of a transmit signal to be transmitted in accordance with a first detailed embodiment of the present invention.
Figure 4:
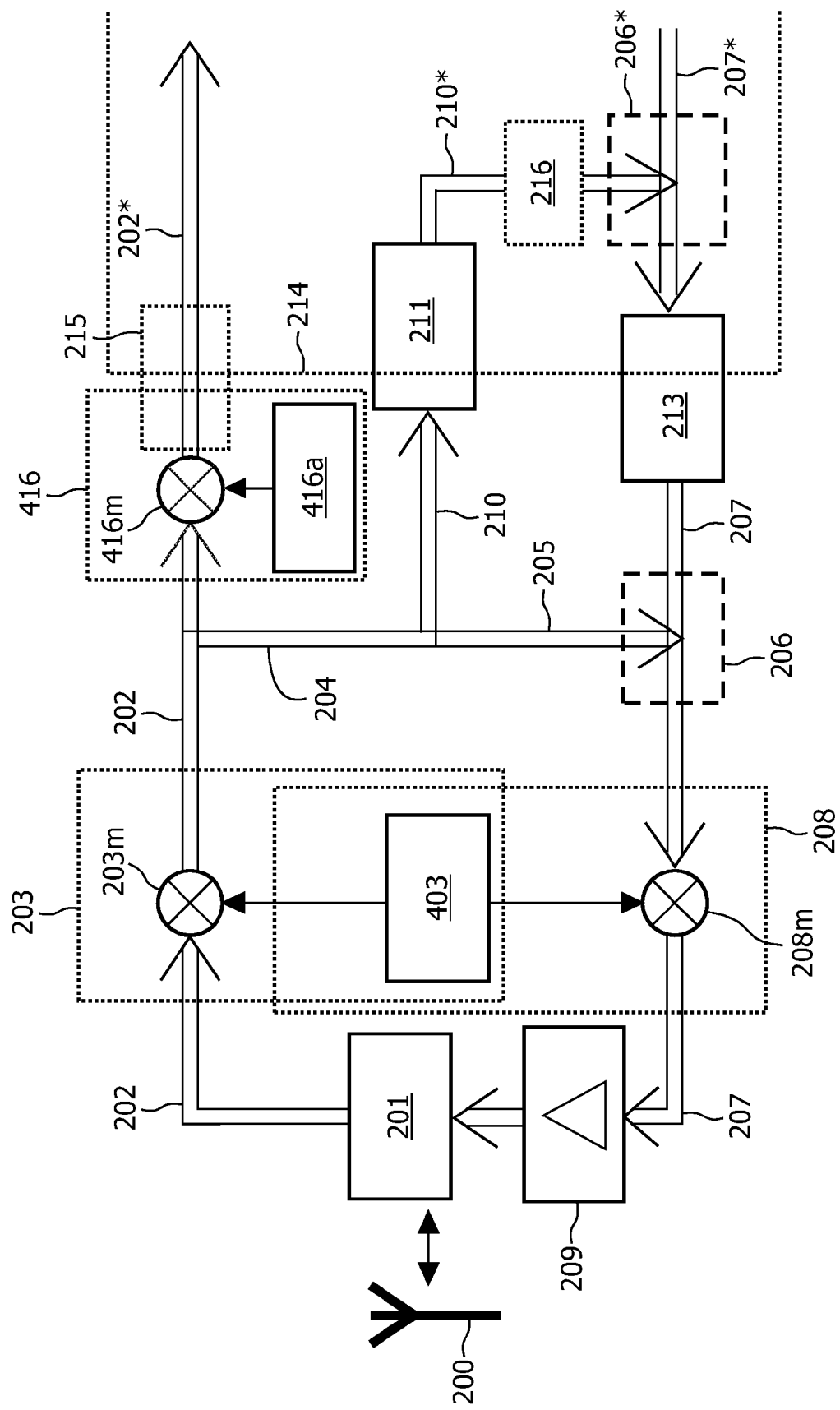
FIG. 4 shows a calibration of a transmit signal to be transmitted in accordance with a second detailed embodiment of the present invention.
Figure 5:
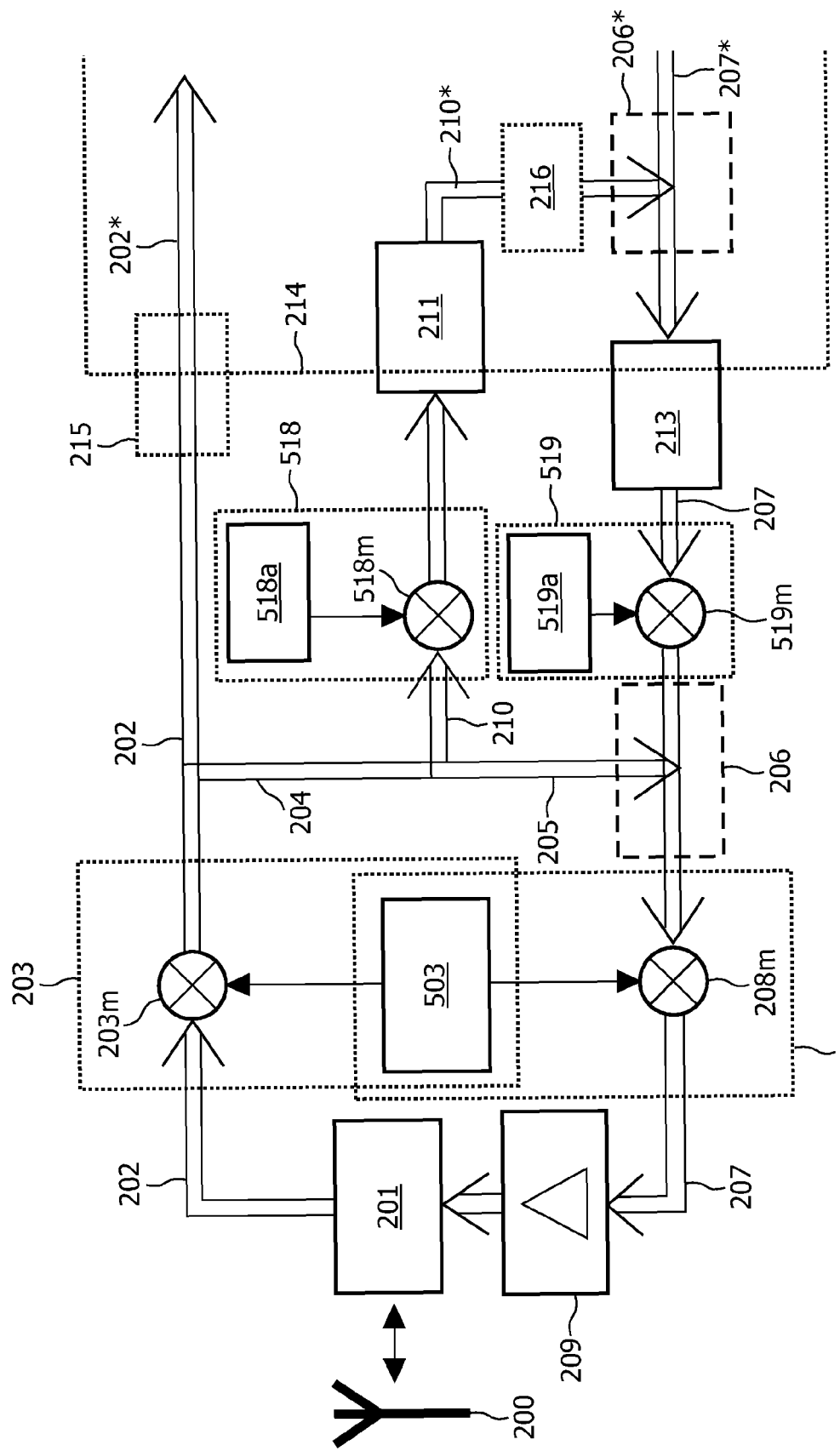
FIG. 5 shows a calibration of a transmit signal to be transmitted in accordance with a third detailed embodiment of the present invention.

As regards the FIGS. 3, 4, and 5, the components provided in these Figures correspond partially the components of FIG. 2 as it can be seen from the reference signs. Therefore, the known components will not be described in detail for the next embodiments and just the ones important for the explanation of the corresponding embodiments will be regarded in more detail.

FIG. 3 shows a calibration of a transmit signal to be transmitted in accordance with a first detailed embodiment of the present invention according to which in the device simultaneously receiving and transmitting signals (the transceiver) the down-conversion means 203 are arranged to down convert receive signal from the receiving frequency band directly down to a zero-IF base band signal. Accordingly, the simultaneously received transmit signal is down-converted to an intermediate frequency (IF) signal corresponding to the value of the frequency band gap or offset between the transmit signal and the receive signal.

With respect to the frequency band gap of 190 MHz as the duplex distance in UMTS FDD, the down-conversion means 203 of the transceiver shown in FIG. 3 down convert the received transmit signal to an intermediate frequency signal corresponding to the value of the frequency band gap between the transmit signal and the receive signal. Hence, the received transmit signal is converted down to around 190 MHz. At leas one mixer 203*m* and a local oscillator 203*a* comprised in the down-conversion means 203 working with an appropriate frequency for down-conversion of the receive signal from the receiving frequency band directly into a zero-IF band signal, that is into the base band. Simultaneously, the down-conversion means 203 down convert the received transmit signal to an intermediate frequency around 190 MHz.

For deriving the desired correction signal from the received transmit signal down converted in the down-converting step to the intermediate frequency of 190 MHz is converted down to around zero frequency by mixing with a applicable frequency provided by a second local oscillator 315*a* in the calibration path 204 such that the received transmit signal at intermediate frequency is moved to zero intermediate frequency (zero-IF). According to the present embodiment, the deriving means 315 are arranged to down convert the received transmit signal, firstly down converted by the down-conversion means 203 to around zero frequency by mixing with a second local oscillator 315*a* frequency in the calibration path 204 such that the received transmit signal at intermediate frequency is mixed down to zero intermediate frequency. There, the deriving means 315 comprise at least one mixer 315*m* and the second local oscillator 315*a*. After the second down-conversion, the analog correction signal is attained, which corresponds to the received transmit signal down-converted nearly to 0 Hz. This analog correction signal can be used for the analog correction or calibration. Alternatively or additionally, the analog correction signal can be converted into a digital signal for the digital correction or calibration as described above (depicted by the path 210, 210*).

As to analog correction or calibration, in the calibrating step the analog correction signal is used to act upon the transmit signal in the base band, i.e. in the zero-IF range, before the transmit signal is up-converted by mixing 208*m* with a frequency provided by a third local oscillator 208*a*. Thus, the calibrating means 206 of the transceiver are arranged to act upon the transmit signal before the transmit signal is up-converted by an appropriate up-conversion means 208 into the transmit frequency band. For that purpose, the up-conversion means 208 are arranged to up convert the transmit signal by mixing with the third local oscillator frequency. In FIG. 3, the up-conversion means 208 are implemented as at least one mixer 208*m* and a local oscillator 208*a*.

The receiver design as used in the present embodiment corresponds generally to the design of a zero-IF-receiver. The down-conversion means 203, the mixer 203*m* and the local oscillator 203*a*, are a mixer and a local oscillator as used in a zero-IF-receiver architecture, which is known per se.

Now reference is made to FIG. 4, which shows calibration of the transmit signal to be transmitted in accordance with a second detailed embodiment of the present invention. According to the embodiment of FIG. 4, the transceiver for simultaneously receiving and transmitting signals is arranged to down convert the receive signal from the receiving frequency band into an IF-band, corresponding to the value of the frequency band gap or offset between the transmit signal and the receive signal. According to the general idea of the invention the intermediate frequency, to which the received transmit signal is down-converted by the down-conversion means 203 of the receiving path 202, which intermediate frequency corresponds to the frequency band gap reduced by the intermediate frequency of the receive signal. As a result, in the down-converting step the received transmit signal is converted down by mixing the received transmit signal with the first local oscillator 403 frequency in the receiving path to an intermediate frequency of around 0 Hz, i.e. to a zero-IF band, in the receiving path 202. Thus, the down-conversion means 203 are arranged to down-convert the received transmit signal by mixing the received transmit signal with the first local oscillator 403 frequency in the receiving path 202 to an intermediate frequency of around 0 Hz in the receiving path 202.

For the sake of completeness, following the receiving path 202, the receive signal is then down-converted by appropriate down-conversion means 416, which at least are achieved by at least one mixer 416*m* and a corresponding local oscillator 416*a*, to an intermediate frequency of around 0 Hz as at first, in the previous down-converting using the down-conversion means 203 with at least one mixer 203*m* and the local oscillator 403, the receive signal was down-converted to 190 MHz.

In the deriving step the analog signal is derived from the received signal down-converted in the down-conversion step 203 by use of the at least one mixer 203*m* and the local oscillator 403 directly.

In the calibrating step the analog signal is acted upon the transmit signal (in the base band) before the transmit signal is up-converted by mixing with a third local oscillator frequency. Thus, the calibrating means 206 are arranged to act it upon the transmit signal (in the basis band) before the transmit signal is up-converted by an appropriate up-conversion means 208 arranged to up convert the transmit signal by mixing with a third local oscillator frequency.

Further, the transmit signal to be transmitted is up-converted 208 after the calibrating step 206 and before the transmission by mixing the calibrated transmit signal with the first local oscillator 403 frequency. Thus, as it can be derived from FIG. 4, the transceiver comprises up-conversion means 208 comprising at least one mixer 208*m* and arranged to up convert the transmit signal to be transmitted by mixing the calibrated transmit signal with the first local oscillator frequency 403 after the calibrating means 206 have been performed and before transmission.

The implementation of the receiver comprised in the transceiver corresponds to hetero-dyne receiver architecture. According to the UMTS-FDD example, the IF-frequency for the receiver is preferably at 190 MHz, which corresponds to the frequency offset between the RX and the TX frequency bands of a particular duplex channel. Hence, in the embodiment of FIG. 4 a single Voltage Controlled Oscillator (VCO) can be used for generation of the first and third oscillator when the transceiver of the transceiver is construed as direct-up-conversion transceiver.

Now reference is made to FIG. 5, which shows calibration of the transmit signal to be transmitted in accordance with a third detailed embodiment of the present invention. The transceiver architecture of FIG. 5 for simultaneously receiving and transmitting signals is arranged to down convert the receive signal from the receiving frequency band, similar to the embodiment of FIG. 3, direct into the base band and thus, the received transmit signal is mixed into an intermediate frequency band around the value of the frequency band gap or offset between the transmit signal and the receive signal.

Once again, the basic concept of the invention uses the known relation between the receiving and transmit frequency bands thus that the intermediate frequency, to which the received transmit signal is down-converted by the down-conversion means 203 of the receiving path 202, which intermediate frequency is arranged to correspond to the frequency band gap reduced by the intermediate frequency of the receive signal. As a result, the receive signal and the received transmit signal arrived on the receiving path 203, are both down-converted, wherein the received transmit signal is down-converted to an intermediate frequency signal corresponding to the value of the frequency band gap between the transmit signal and the receive signal, that is in the UMTS FDD example 190 MHz. This is performed by corresponding down-conversion means 203, which can be implemented by at least one mixer 203m and a first local oscillator 503.

Now instead of a second down-conversion of the intermediate received transmit signal to the base band, an intermediate frequency is used in the transmitting path. Accordingly, the transmit path 207 comprises up-conversion means 519 which at first up-convert an input transmit signal to an intermediate transmit signal by mixing the transmit signal with a local oscillator frequency in the transmit path 207 to an intermediate frequency also corresponding to the value of the frequency band gap between the transmit signal and receive signal. In the case of the example, i.e. the UMTS FDD system, the transmit signal is at around 190 MHz as the offset between the transmit signal band and the receive signal band of a particular duplex channel.

Accordingly, the transceiver comprises up-conversion means 520 arranged to up convert the transmit signal in transmit path 207 to an intermediate transmit signal by mixing the transmit signal with a local oscillator 519a frequency in the transmit path 207 to an intermediate frequency corresponding to the value of the frequency band gap between the transmit signal and the receive signal. The corresponding up-conversion means 519 are arranged as at least one mixer 519m and a local oscillator 519a using an appropriate frequency.

Thus, when deriving the analog correction signal from the received transmit signal down-converted to an intermediate frequency signal, it is possible to use this analog correction signal in calibration—such that the intermediate transmit signal acts upon the corresponding correction signal. In FIG. 5, this calibration step is performed by the calibration means 206.

Finally, the calibrated intermediate transmit signal is up-converted by mixing the calibrated intermediate transmit signal with the first local oscillator 503 frequency. There, the up-conversion means 208 are accordingly arranged to up convert the calibrated intermediate transmit signal to the respective transmit signal band, which again can be advantageously achieved by mixing the calibrated intermediate transmit signal with the frequency provided by the first local oscillator 503. In other words, presenting the embodiments of FIGS. 4 and 5, the transceiver uses the same local oscillator 403 or 503 as the receiver. Thus, in both cases an oscillator can be omitted and the complexity can be reduced.

If also digital calibration is desired, for the digital calibration path 210, the analog correction signal has first to be down-converted to the base band in the digital calibration path 210*, for use as basis for the digital correction signal. For this reason, appropriate down-calibration means 518 are implemented on the digital calibration path 210*, wherein a mixer 508m and a local oscillator 518a can be used in the corresponding down-calibration means 518 on the digital calibration path 210*.

Figure 6:
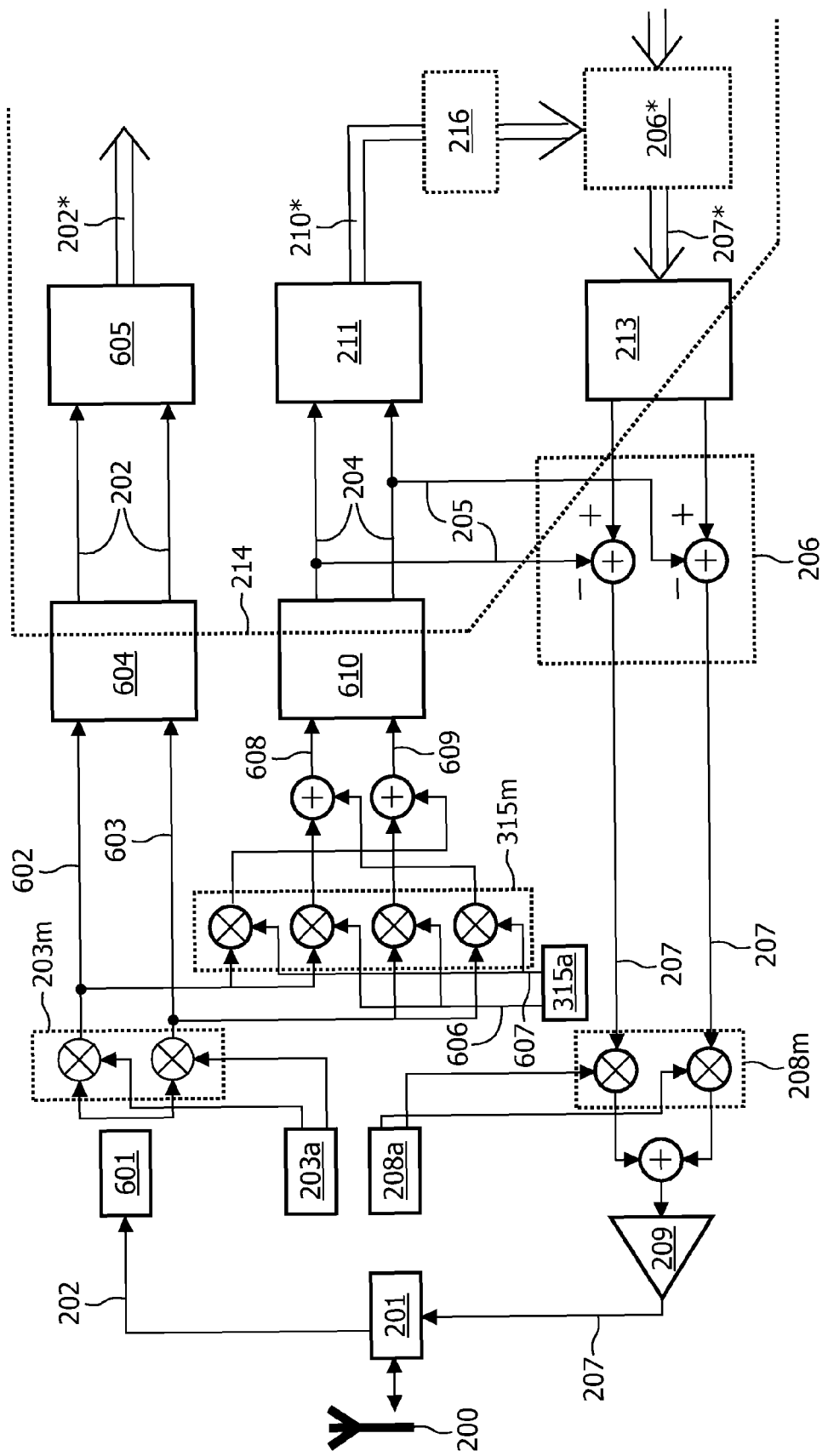
FIG. 6 shows a detailed design of a transceiver based on the first detailed embodiment of the present invention.

Finally yet importantly, FIG. 6 shows a more detailed design schema for a transceiver based on the first detailed embodiment of the present invention as illustrated in FIG. 3. The receiver comprises a zero-IF receiver architecture and according to the case of the UMTS-FDD standard, the transmit signal, which is received in the receiver on the receiving path 202, is present around 190 MHz in the IF-path. As already described in connection with FIG. 3, a second down-conversion means 315 comprising at least one mixer 315m (in FIG. 3 represented just as one single mixer) is used to convert this received transmit signal down from 190 MHz to the base band, i.e. zero-IF. The down-converted signal is used directly as correction signal to correct the analog transmit signal and/or after a respective analog-to-digital conversion to correct the digital transmit signal on the transmit path 207. Further, the digital correction signal may be pre-distorted by respective pre-distorting means 216 before used at 206* for the correction of an incoming transmit signal in the digital domain.

In FIG. 6, a received signal at the antenna 200 is filtered for example by a duplex filter 201 to attenuate signals outside the receiving path 202. There, also the simultaneously received transmit signal is attenuated somewhat. A low-noise amplifier 601 then amplifies both the received transmit signal and the receive signal. After that, both signals are down-converted by mixing with the respective I (in-phase) and Q (quadrature) oscillator frequencies of the local oscillator 203a to an IF I-signal 602 and to an IF Q-signal 603 by respective I- and Q-mixers 203m. Next, the receiving I- and Q-signals are low pass filtered to remove non-UMTS signals and an Automatic Gain Control (AGC) may be applied to the I- and Q-signal in block 604. Then, the corresponding I- and Q-signals can be converted into the digital domain, for example by means of two real A/D-converters or a single complex AD-converter 605.

As already explained above, the part of the transmit signal leaking into the receiving path 202, after down-conversion with the first local oscillator 203a, is not located at around 0 Hz (zero-IF-band) as it is the case for the receive signal. The received part of the transmit signal appears at an intermediate frequency band of around 190 MHz because of the configuration of the receiver such that the frequency band gap between the transmit signal and the receive signal determines the location of the intermediate frequency band. A second down-conversion 315 with the oscillator 315a converts this intermediate received transmit signal down to around 0 Hz. The analog signal received after the second down-conversion 315 with respective I- and Q-frequencies of the local oscillator 315a is then used as correction signal in the direct up-conversion transceiver. After filtering (low pass filtering) and AGC in block 610 the correction signal follows the calibration path 204 and turns into the analog calibration path 205 to perform the calibration or correction of the transmit signal in block 206.

When alternatively or additionally digital correction or calibration at 206* is to be per-formed, the analog correction signal, after block 610, is converted into the digital domain 214 of the calibration path 210* and used as correction signal, wherein the analog signal is converted into the digital domain 214 using two AD-converters for example represented as block 211 in FIG. 6. Thus, a digital correction signal can be used in the digital part or domain 214 of the transceiver.

The embodiment as described in the text above and sketched in FIG. 6 as well the embodiments presented in FIGS. 2 to 5 provide the advantage of reduction of power consumption on at least one radio frequency amplifier, complex down-converter, local oscillator buffer-amplifiers, and IF-amplifier or IF-filter required in the state of the art.

Furthermore, the processing according to the present invention is performed at low frequencies thus saving the processing costs.

Additionally, a VCO at 100 MHz or below can be realized as a simple ring-oscillator or respective known Metal Oxide Semiconductor (MOS) devices can be used. Thus, a further possibility of reducing the power consumption can be achieved.

Regarding the implementation of respective circuit elements and functionalities in connection with the concept disclosed herein, further information can be gathered from J. Janssens and M. Steyaert, "CMOS Cellular Receiver Front-Ends from Specification", Kluwer Academic Publishers, 2002, ISBN 0-7923-7637-4 and from J. Crols and M. Steyaert, "CMOS wireless transceiver design", Kluwer Academic Publishers, 1997, ISBN 0-7923-9960-9.

However, it is noted that while the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A method of calibration of a transmit signal to be transmitted in a device simultaneously receiving and transmitting signals in a communication system, which device comprises a receiving path for a receive signal (RXS), a transmit path for the transmit signal (TXS), a calibration path for a correction signal (CS), the transmit signal being also received in the receiving path and the transmit signal and the receive signal being separated by a predetermined frequency band gap, wherein the transmit signal (TXS) is inserted or leaks into the receiving path as a received transmit signal, the method comprising:
    down-converting the received transmit signal to an intermediate frequency by mixing the received transmit signal with a first local oscillator frequency in the receiving path, wherein the intermediate frequency substantially corresponds to the frequency band gap reduced by the intermediate frequency of the receive signal;
    deriving an analog correction signal from the received transmit signal converted down in the down-converting step, wherein the deriving step is performed in the calibration path; and
    calibrating the transmit signal by a one of acting with the analog correction signal on the transmit path upon the transmit signal and converting the analog correction signal into a digital correction signal and calibrating the transmit signal by acting with the digital correction signal on the transmit path in the digital domain upon the digital transmit signal to be transmitted.

2. The method according to claim 1, wherein in the deriving step the received transmit signal down converted in the down-converting step to the intermediate frequency is converted down by mixing with a second local oscillator frequency in the calibration path such that the intermediate frequency is a zero intermediate frequency; and in the calibrating step it is acted upon the transmit signal in the base band.

3. The method according to claim 1, wherein in the down-converting step the received transmit signal is converted down by mixing the received transmit signal with the first local oscillator frequency in the receiving path to a zero intermediate frequency in the receiving path; and in the calibrating step it is acted upon the transmit signal in the base band.

4. The method according to claim 3, wherein the transmit signal to be transmitted is up-converted after the calibrating step and before the transmission by mixing the calibrated transmit signal with the first local oscillator frequency.

5. The method according to claim 1, wherein the method further comprises up-converting the transmit signal in transmit path to an intermediate transmit signal by mixing the transmit signal with a third local oscillator frequency in the transmit path to an intermediate frequency corresponding to the value of the frequency band gap; and wherein in the calibrating step it is acted upon the intermediate transmit signal by the correction signal; and wherein the calibrated intermediate transmit signal is up-converted by mixing the calibrated intermediate transmit signal with the first local oscillator frequency.

6. The method according to claim 1, wherein the method further comprises pre-distorting of the digital correction signal.

7. The method according to claim 1, wherein the communication system is a communication system using Frequency Division Duplex (FDD).

8. A non-transitory computer program product comprising code means for carrying out a method for controlling calibration of a transmit signal, the computer program product performing the steps of a method according to claim 1 when run on a respective microcontroller of a transceiver controlled by the microcontroller.

9. A transceiver simultaneously receiving and transmitting signals in a communication system, wherein the transceiver comprises a receiving path for a receive signal; a transmit path for a transmit signal; and a calibration path for a correction signal, wherein the transmit signal and the receive signal being separated by a predetermined frequency band gap and the transmit signal being also received in the receiving path, which device comprises:
    down-conversion means arranged to down convert the received transmit signal to an intermediate frequency by mixing the received transmit signal with a first local oscillator frequency in the receiving path, wherein the intermediate frequency corresponds substantially to the frequency band gap reduced by the intermediate frequency of the receive signal;
    deriving means arranged to derive an analog correction signal as the correction signal in the conversion path from the received transmit signal converted down by the down-conversion means;
    calibrating means arranged to calibrate the transmit signal by acting with the analog correction signal on the transmit path upon the transmit signal;
    means arranged to convert the analog correction signal into a digital signal; and
    means arranged to calibrate the transmit signal to be transmitted by acting upon the transmit signal to be transmitted with the digital correction signal on the transmit path in the digital domain.

10. The transceiver according to claim 9, wherein the deriving means are further arranged to down convert the received transmit signal, firstly down converted by said down-conversion means to the intermediate frequency, to around zero frequency by mixing with a second local oscillator frequency in the calibration path such that the intermediate frequency is a zero intermediate frequency; and wherein the calibrating means are arranged to act it upon the transmit signal in the base band.

11. The transceiver according to claim 9, wherein the down-conversion means are arranged to down convert the received transmit signal by mixing the received transmit signal with the first local oscillator frequency in the receiving path to an intermediate frequency of around 0 Hz in the receiving path; and wherein the calibrating means are arranged to act it upon the transmit signal in the basis band.

12. The transceiver according to claim 11, wherein the transceiver comprise an up-conversion means arranged to up convert the transmit signal to be transmitted by mixing the calibrated transmit signal with the first local oscillator frequency after the calibrating means have been performed and before transmission.

13. The transceiver according to claim 9, wherein the transceiver further comprises an up-conversion means arranged to up convert the transmit signal in transmit path to an intermediate transmit signal by mixing the transmit signal with a third local oscillator frequency in the transmit path to an intermediate frequency corresponding to the value of the frequency band gap; and wherein the calibrating means are arranged to act it upon the intermediate transmit signal by the correction signal; and wherein the up-conversion means are arranged to up convert the calibrated intermediate transmit signal by mixing the calibrated intermediate transmit signal with the first local oscillator frequency.

14. The transceiver according to claim 9, wherein the calibrating means comprises means arranged to pre-distort the digital correction signal.

* * * * *